(12) United States Patent
Shibata

(10) Patent No.: US 6,864,587 B2
(45) Date of Patent: Mar. 8, 2005

(54) SEMICONDUCTOR DEVICE

(75) Inventor: Jun Shibata, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/389,958

(22) Filed: Mar. 18, 2003

(65) Prior Publication Data

US 2004/0065944 A1 Apr. 8, 2004

(30) Foreign Application Priority Data

Oct. 8, 2002 (JP) ........................................ 2002-295175

(51) Int. Cl.[7] .......................... H01L 23/48; H01L 23/52; H01L 29/40
(52) U.S. Cl. .......................... 257/784; 257/690; 257/737
(58) Field of Search ................................ 257/690, 784, 257/737, 738

(56) References Cited

U.S. PATENT DOCUMENTS 6,605,871 B2 * 8/2003 Chaki .......................... 257/728

2002/0125569 A1 * 9/2002 Fukuda et al. .............. 257/737

FOREIGN PATENT DOCUMENTS

| JP | 11-219967 | | 8/1999 |
|----|-----------|---|--------|
| JP | 11-219967 | * | 10/1999 |
| JP | P2001-135794 A | | 5/2001 |

* cited by examiner

*Primary Examiner*—Phat X. Cao
(74) *Attorney, Agent, or Firm*—McDermott Will & Emery LLP

(57) ABSTRACT

A semiconductor device comprises a semiconductor substrate, an interlayer insulating film formed on the semiconductor substrate, a first pad, a second pad and a conductor. The first pad is formed on the interlayer insulating film and its circumferential edges are covered with a first surface-protecting film. The second pad formed on the interlayer insulating film facing the first pad across a second surface-protecting film, and its circumferential edges are covered with a third surface-protecting film. The conductor is provided continuously on the first pad, the first to third surface-protecting films, and the second pad.

10 Claims, 15 Drawing Sheets

I-I CROSS-SECTION

II-II CROSS-SECTION

III-III CROSS-SECTION

IV-IV CROSS-SECTION

V-V CROSS-SECTION

VI-VI CROSS-SECTION

VII-VII CROSS-SECTION

VIII-VIII CROSS-SECTION

IX-IX CROSS-SECTION

IX-IX CROSS-SECTION

US 6,864,587 B2

SEMICONDUCTOR DEVICE

BACKGROUND OF THE INVENTION

1. Field of the Invention

The present invention relates to a semiconductor device having a plurality of functions and states (hereafter referred to as options), whose options can be set by an externally supplied voltage.

2. Background Art

A conventional semiconductor device has an option-setting portion composed of a plurality of pads disposed in electrically non-contacting state from an opening formed in a surface-protecting film, and options are set by whether or not the pads of the option-setting portions are short-circuited by stud bumps (see, for example, Japanese Patent Laid-Open No. 2001-135794 (pp. 1–4, FIGS. 1 to 3)).

Since a stud bump is formed on an interlayer insulating film having no surface-protecting film between pads, conventional semiconductor devices have a problem of the occurrence of cracks in interlayer insulating films that lowers a reliability of products. Since there are no surface-protecting films on the sides facing pads, conventional semiconductor devices also have a problem of pad peeling due to a tensile force that occurs when a wire is cut from a stud bump in the formation of the stud bump.

An object of the present invention is to solve the above-described problems, and to provide a semiconductor device wherein cracks of interlayer insulating films and pad peeling due to option setting are hard to occur.

SUMMARY OF THE INVENTION

According to one aspect of the present invention, a semiconductor device comprises a semiconductor substrate, an interlayer insulating film formed on the semiconductor substrate, a first pad, a second pad and a conductor. The first pad is formed on the interlayer insulating film and its circumferential edges are covered with a first surface-protecting film. The second pad formed on the interlayer insulating film facing the first pad across a second surface-protecting film, and its circumferential edges are covered with a third surface-protecting film. The conductor is provided continuously on the first pad, the first to third surface-protecting films, and the second pad.

Other and further objects, features and advantages of the invention will appear more fully from the following description.

DETAILED DESCRIPTION OF THE PREFERRED EMBODIMENTS

First Embodiment

Figure 1:
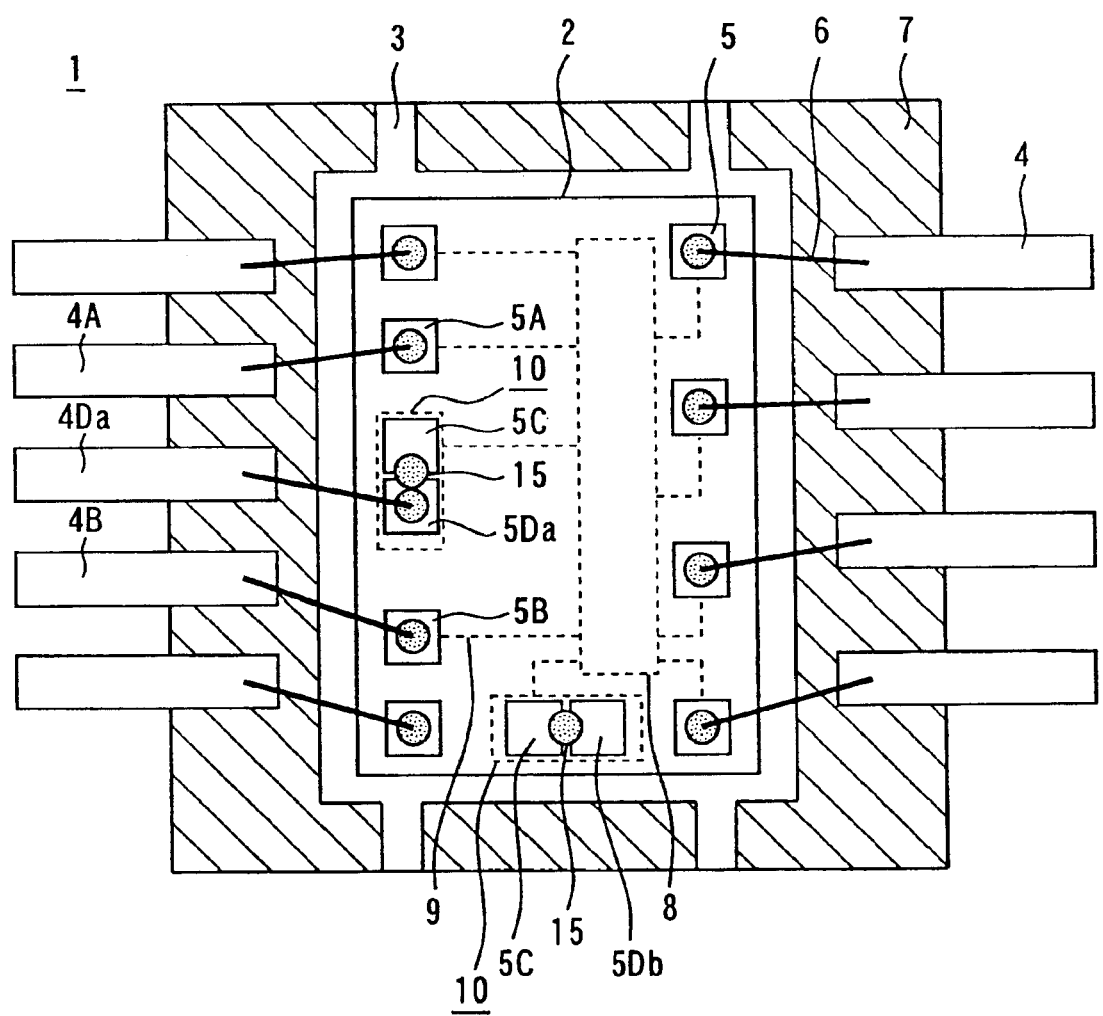
FIG. 1 is a plan showing a semiconductor device according to a first embodiment of the present invention.

FIG. 1 is a plan showing a semiconductor device according to a first embodiment of the present invention, wherefrom an upper half of a sealing resin is cut away. In FIG. 1, reference numeral 1 denotes a semiconductor device; 2 denotes a semiconductor substrate; 3 denotes a die pad whereon the semiconductor substrate 2 is placed; 4 denotes lead terminals for electrically connecting the semiconductor device 1 to external devices (not shown); 5 denotes pads for power supply and signal input/output of the semiconductor substrate 2; 6 denotes thin metal wires for electrically connecting the lead terminals 4 to the pads 5; 7 denotes a sealing resin for protecting the semiconductor substrate 2, the metal wires 6, or the like; 8 denotes an internal circuit for implementing the functions of the semiconductor device 1; 9 denotes internal wirings for electrically connecting the internal circuit 8 to the pad 5; 10 denotes an option-setting portion for setting the options of the semiconductor device 1; and 15 denotes stud bumps, dielectric, for electrically connecting a plurality of pads 5. Since the internal circuit 8, the internal wirings 9, and a part of the pads 5 underlie other constitution elements; these are shown by broken lines, in FIG. 1.

Figure 2A:
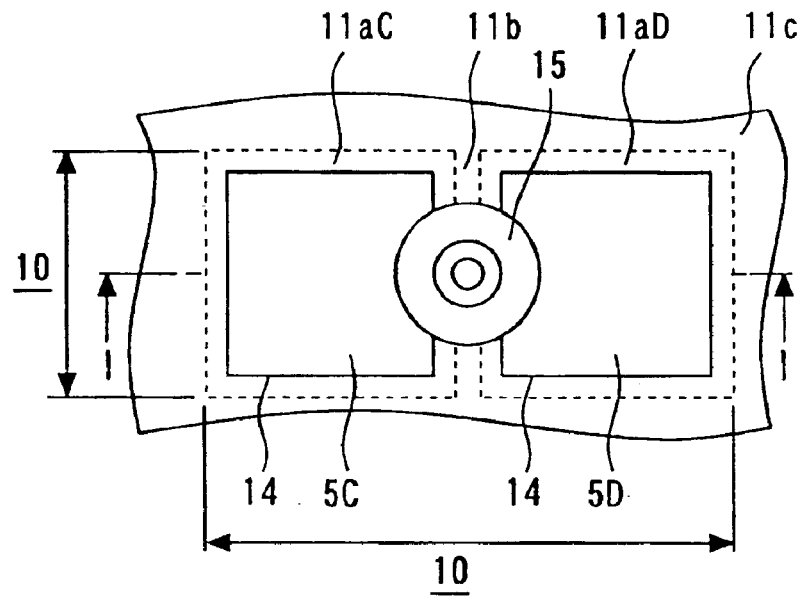
FIG. 2 shows the option-setting portion of the semiconductor device according to the first embodiment of the present invention.
Figure 2B:
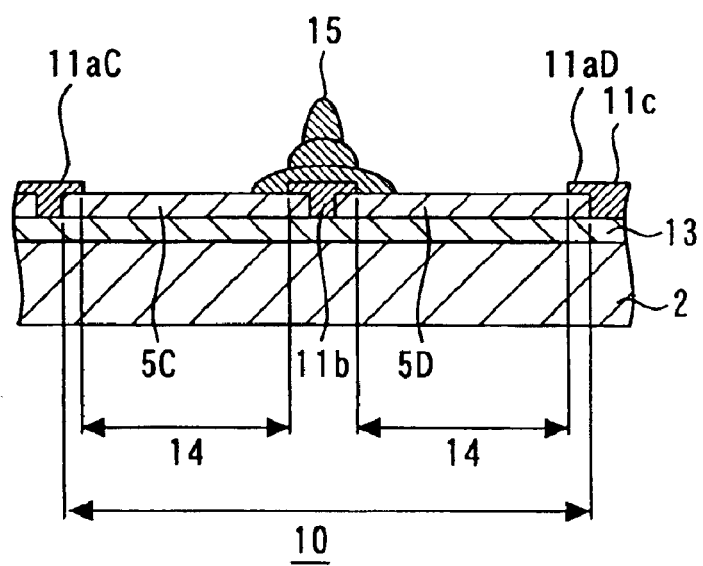

FIG. 2 shows the option-setting portion 10 in detail; FIG. 2A being a plan, and FIG. 2B being a sectional view along a dashed line I—I in FIG. 2A. The option-setting portion 10 comprises an option-setting pad 5C, which is a second pad, for inputting a voltage for setting options, and a fixed-potential pad 5D, which is a first pad, maintained at an optional constant voltage (in the following drawings, the fixed-potential pad whose potential is the source voltage is denoted by 5Da, and the one whose potential is GND is denoted by 5Db); and these are disposed across a surface-protecting film 11b, which is a second surface-protecting film (in the following drawings, the second surface-protecting film positioned between the option-setting pad 5C and the fixed-potential pad 5C is denoted by 11b). Reference numeral 13 denotes an interlayer insulating film for separating elements (not shown) and wirings (not shown) composing the internal circuit 8 laminated on the semiconductor substrate 2. Although not shown in FIG. 2, a plurality of internal wirings 9 and interlayer insulating films 13 may further be formed between the semiconductor substrate 2 and the interlayer insulating film 13. The circumferential edges of surface of the option-setting pad 5C are surrounded with a surface-protecting film 11aC, which is a third surface-protecting film, (in the following drawings, the third surface-protecting film to cover the upper circumference of an option-setting pad is denoted by 11aC); the circumferential edges of surface of the fixed-potential pad 5D are surrounded with a surface-protecting film 11aD, which is a first surface-protecting film, (in the following drawings, the first surface-protecting film to cover the circumferential edge of a fixed-potential pad 5D is denoted by 11aD); and the portions not covered by surface-protecting films 11aC and 11aD are pad openings 14 whose surfaces are exteriorly exposed. Reference numeral and character 11c denotes a surface-protecting film that covers the surface of the semiconductor substrate other than the option-setting portion 10.

In the semiconductor device 1 of FIG. 1, the option-setting portion 10 provided on the left-hand side thereof is the one for determining the operating frequency of the internal circuit 8, and the internal circuit 8 is so designed as to operate at an operating frequency of 100 MHz when the source voltage is supplied to the option-setting pad 5C, and 120 MHz when the option-setting pad 5C is open. The option-setting portion 10 provided on the lower side thereof is the one for selecting the processing standards, and the internal circuit 8 is so designed as to perform the calculation of input data in accordance with standard A when GND is supplied to the option-setting pad 5C, and accordance with standard B when the option-setting pad 5C is open.

Figure 3A:
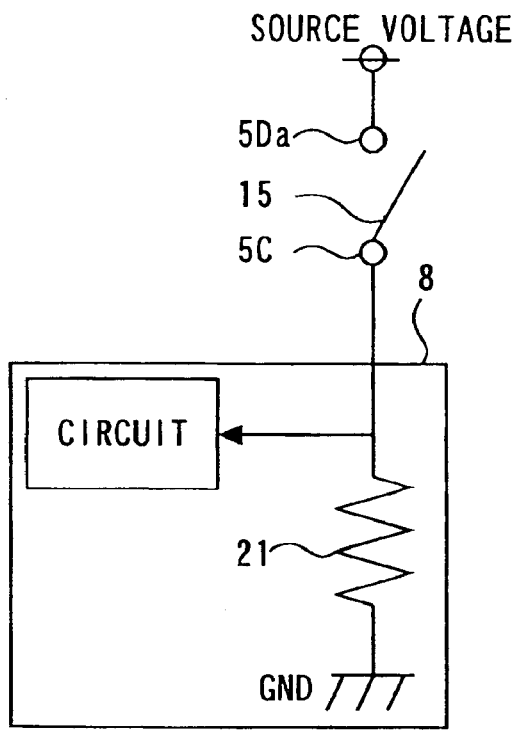
FIG. 3 is a schematic diagram for illustrating the connecting portions of the option-setting pad and the internal circuit of the semiconductor device according to the first embodiment of the present invention.

FIG. 3 is a schematic diagram for illustrating the connecting portions of the option-setting pad 5C of the two option-setting portions 10 and the internal circuit 8 shown in FIG. 1; and the option-setting pad 5C of the option-setting portion 10 on the left-hand side of the semiconductor device 1 in FIG. 1 is pulled down to GND through a resistor 21 as shown in FIG. 3A, and GND is supplied to the internal circuit 8 when switched off (absence of the stud bump 15) and the source voltage is supplied to the internal circuit 8 when switched on (presence of the stud bump 15).

Figure 3B:
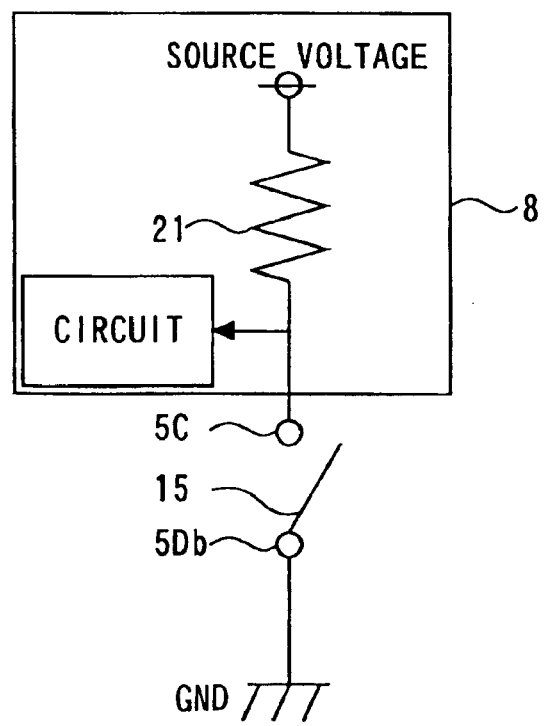

On the other hand, the option-setting pad 5C of the option-setting portion 10 on the lower side of the semiconductor device 1 in FIG. 1 is pulled up to the source voltage through a resistor 21 as shown in FIG. 3B, and source voltage is supplied to the internal circuit 8 when switched off (absence of the stud bump 15) and the GND is supplied to the internal circuit 8 when switched on (presence of the stud bump 15).

In order to make the semiconductor device 1 operate in accordance with standard A at an operating speed of 100 MHz, an existing wire-bonding technique is employed to form a stud bump 15 so as to cover the fixed-potential pad 5Da set at the source voltage of the option-setting portion 10 on the left-hand side of the semiconductor device 1, the surface-protecting film 11aD that covers the circumferential edges of the fixed-potential pad 5Da, the surface-protecting film 11b between the fixed-potential pad 5Da and the option-setting pad 5C, the surface-protecting film 11aC that covers the circumferential edges of the option-setting pad 5C, and the option-setting pad 5C; and to continuously form a stud bump 15 on the fixed-potential pad 5Db set at GND of the option-setting portion 10 on the lower side of the semiconductor device 1, the surface-protecting film 11aD that covers the circumferential edges of the fixed-potential pad 5Db, the surface-protecting film 11b between the fixed-potential pad 5Db and the option-setting pad 5C, the surface-protecting film 11aC that covers the circumferential edges of the option-setting pad 5C, and the option-setting pad 5C. A predetermined voltage is supplied to the fixed-potential pad 5Da from a power lead terminal 4Da (lead terminal connected to an external power source) connected thereto with a thin metal wire 6; and to the fixed-potential pad 5Db from the GND wiring of the internal circuit 8 (not shown) connected thereto with an internal wiring 9. Although a thin metal wire 6 is used for supplying a voltage to the fixed-potential pad 5Da, voltage supply to fixed-potential pad 5D may be all performed by the internal wiring 9 to eliminate the lead terminals 4D for the fixed-potential pad, and the thin metal wires 6 for connecting thereto.

In the semiconductor device 1 of the first embodiment, since stud bumps 15 are formed on the surface-protecting film 11b between pads 5, damage to the interlayer insulating film 13 underlying the surface-protecting film 11b is hard to occur. Also in the semiconductor device 1 of the first embodiment, since all the circumferential edges of pads are covered with the surface-protecting films 11aC and 11aD, the peeling of pads 5 due to tensile force when a wire (not shown) is cut from the stud bump 15 is hard to occur.

The stud bumps 15 used in the semiconductor device 1 of the first embodiment can be formed by an ordinary method using a normal wire bonder that uses gold or other metals. In addition, metal bumps formed by plating, metal films formed by vapor deposition, beam leads, conductive resins, or the like may be used as the conductor instead of the stud bumps 15. Furthermore, although the semiconductor device 1 of the first embodiment is a package of a lead-terminal type, it may be a package of a ball-grid-array type or a tape-carrier type.

Second Embodiment

Figure 4A:
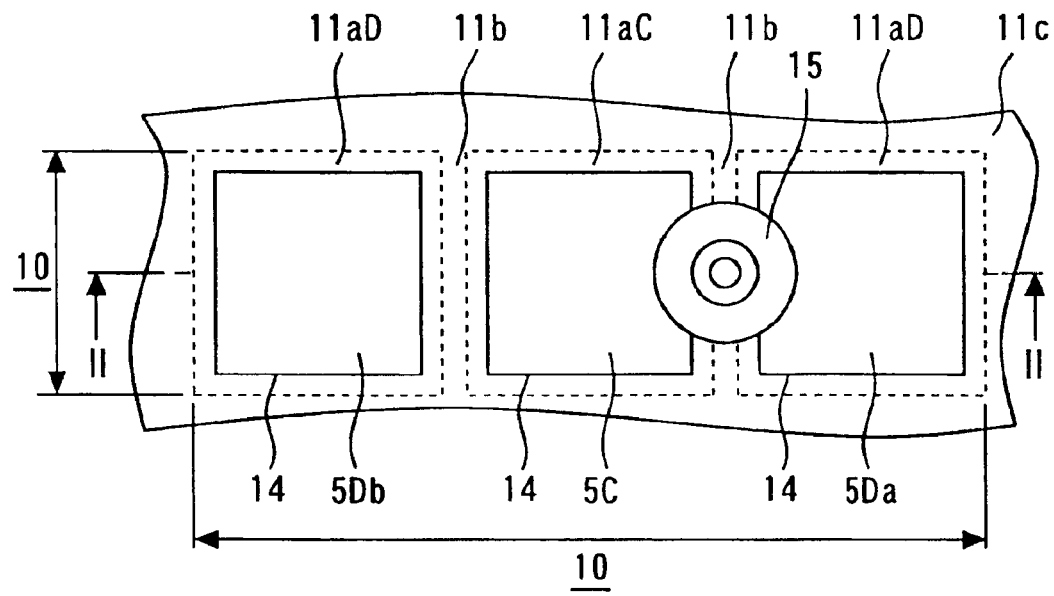
FIG. 4 shows an option-setting portion of a semiconductor device according to the second embodiment of the present invention.
Figure 4B:
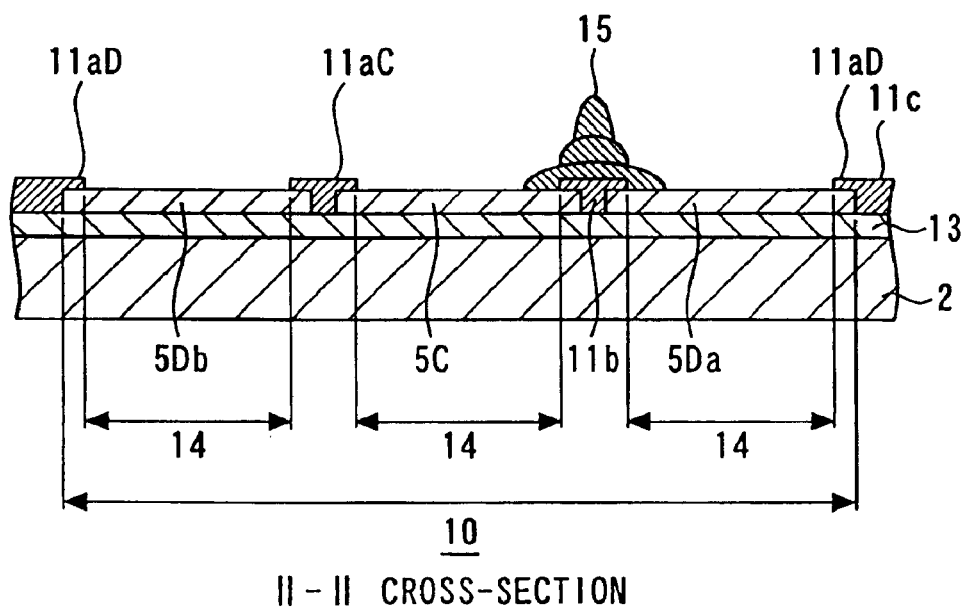
Figure 5:
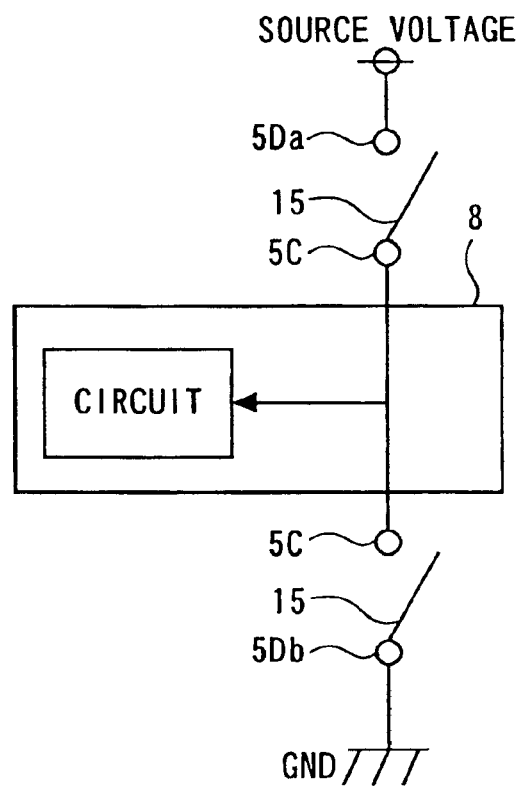
FIG. 5 is a schematic diagram for illustrating the connecting portions of the option-setting pad and the internal circuit of the semiconductor device according to the second embodiment of the present invention.

FIG. 4 shows an option-setting portion 10 of a semiconductor device according to a second embodiment of the present invention, FIG. 4A being a plan, and FIG. 4B being a sectional view along a dashed line II—II in FIG. 4A. FIG. 5 is a schematic diagram of a connecting part between the option-setting pad 5C and the internal circuit 8 of the semiconductor device according to the second embodiment of the present invention. The same or like parts as in FIGS. 1 to 3 are denoted by the same reference numerals, and the description thereof will be omitted. The option-setting portion 10 comprises an option-setting pad 5C, a fixed-potential pad 5Da set to the source voltage, a fixed-potential pad 5Db set to GND, and a surface-protecting film 11b positioned between pads 5. The circumferential edges of the surface of the option-setting pad 5C are covered with a surface-protecting film 11aC; and the circumferential edges of the surfaces of the fixed-potential pads 5Da and 5Db are covered with a surface-protecting film 11aD.

The option-setting pad 5C and an internal circuit 8 connected thereto are constituted as FIG. 5 shows, and when the option-setting pad 5C is connected to the fixed-potential pad 5Da set to the source voltage by a stud bump 15, the source voltage is supplied to the internal circuit 8, and the internal circuit 8 performs the operation responding to the input of the source voltage. On the other hand, when the option-setting pad 5C is connected to the fixed-potential pad 5Db set to GND by a stud bump 15, the GND is supplied to the internal circuit 8, and the internal circuit 8 performs the operation responding to the input of GND.

Although the semiconductor device 1 of the first embodiment has an advantage that the option-setting portion 10 can be composed of an option-setting pad 5C and a fixed-potential pad 5D as FIG. 1 shows, it has a problem that a current flows steadily in the resistor 21 and power consumption increases, when the option-setting pad 5C is connected to the fixed-potential pad 5Da set to the source voltage by a stud bump 15. However, in the case of the semiconductor device of the second embodiment, no steady current flows in the resistor 21 when the option-setting pad 5C is connected to either the fixed-potential pad 5Da set to the source voltage or the fixed-potential pad 5Db set to GND shown in FIG. 5 and increase in power consumption does not occur.

Third Embodiment

Figure 6:
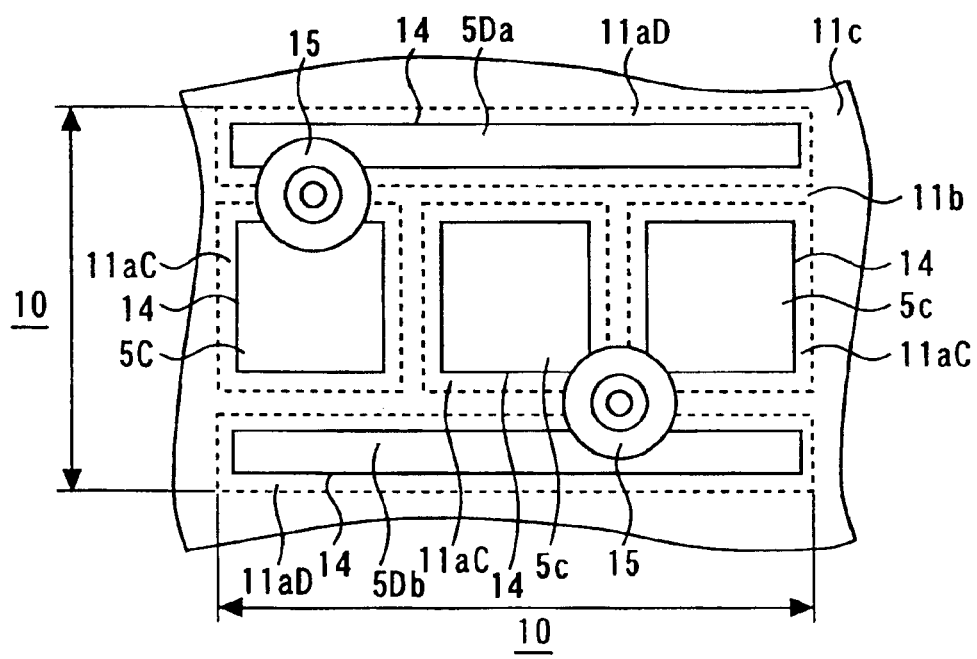
FIG. 6 shows an option-setting portion of a semiconductor device according to the third embodiment of the present invention.

FIG. 6 is a plan showing the option-setting portion of a semiconductor device according to a third embodiment of the present invention. The option-setting portion 10 of the third embodiment comprises three option-setting pad 5C disposed across a surface-protecting film 11b, a fixed-potential pad 5Da set to the source voltage disposed so as to face the three option-setting pad 5C across the surface-protecting film 11b, and a fixed-potential pad 5Db set to GND disposed so as to face the three option-setting pad 5C across the surface-protecting film 11b. The circumferential edges of the surface of the option-setting pad 5C are covered with a surface-protecting film 11aC, and the circumferential edges of the surface of the fixed-potential pads 5Da and 5Db are covered with a surface-protecting film 11aD.

Since the option-setting portion 10 sets the option-setting pad 5C on the left-hand end in FIG. 6 to the source voltage, a stud bump 15 is formed so as to contact the option-setting pad 5C on the left-hand end and the fixed-potential pad 5Da set to the source voltage; and since the option-setting portion 10 sets the option-setting pad 5C on the center and the right-hand end in FIG. 6 to GND, another stud bump 15 is formed so as to contact the option-setting pad 5C on the center, the option-setting pad 5C on the right-hand end, and the fixed-potential pad 5Db set to GND.

Since the semiconductor device 1 of the third embodiment has a plurality of option-setting pad 5C on the option-setting portion 10, it enables various option settings. Furthermore, since the semiconductor device 1 of the third embodiment has a structure wherein a plurality of option-setting pads 5C can be connected to the same fixed-potential pad 5D, the number of the fixed-potential pads can be reduced, and the size of the semiconductor substrate 2 can be reduced. In addition, since the semiconductor device 1 of the third embodiment enables the voltage setting of a plurality of option-setting pads 5C using one stud bump 15, the option-set semiconductor device 1 can be manufactured in a few man-hours.

Fourth Embodiment

Figure 7A:
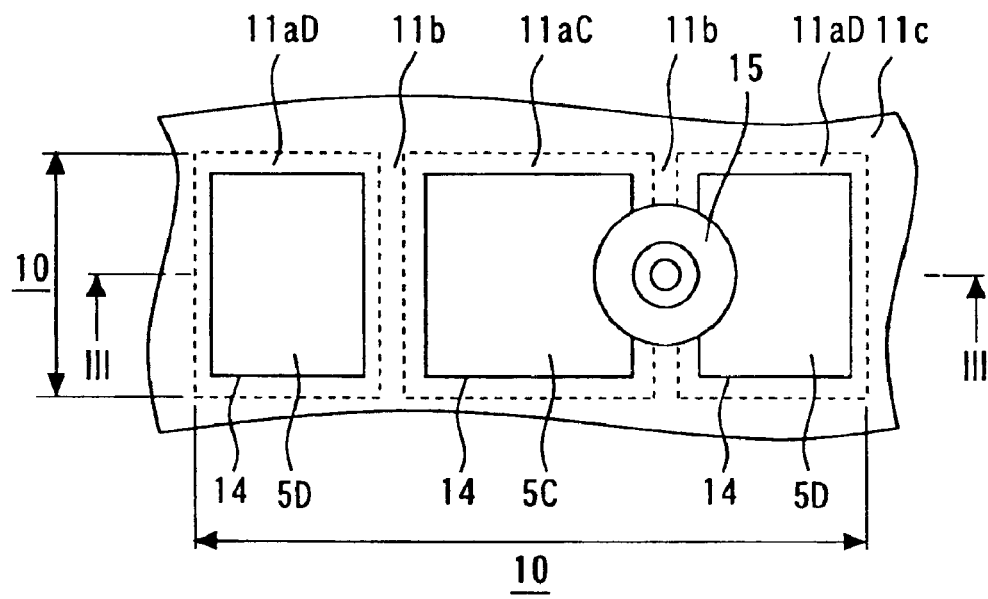
FIG. 7 shows an option-setting portion of a semiconductor device according to the fourth embodiment of the present invention.
Figure 7B:
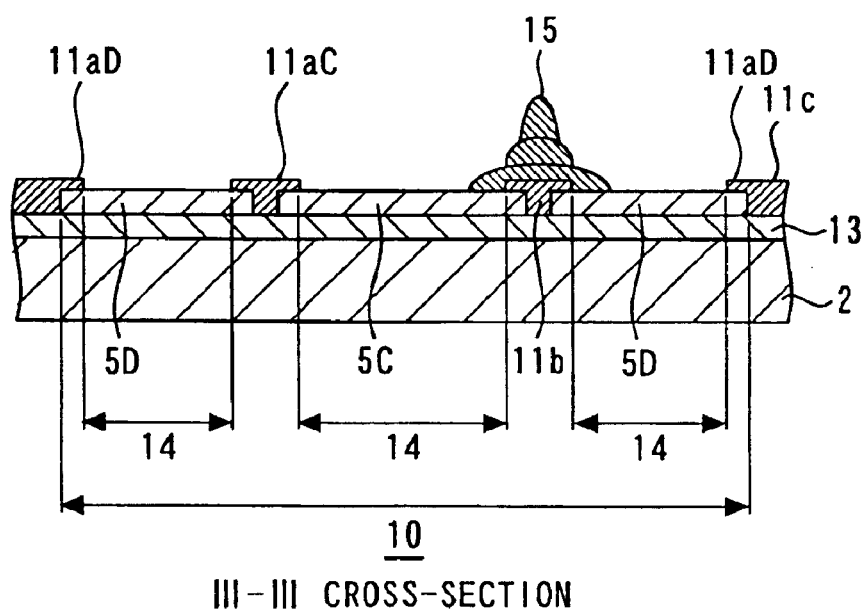

FIG. 7 shows an option-setting portion 10 of a semiconductor device according to a fourth embodiment of the present invention, FIG. 7A being a plan, and FIG. 7B being a sectional view along a dashed line III—III in FIG. 7A. The area of the fixed-potential pad 5D of the semiconductor device 1 of the fourth embodiment is smaller than other pads connec formed on the interlayer insulating film whereto thin metal wires are connected (hereafter referred to as a third pad). As described in the first embodiment, since a fixed voltage can be supplied to the fixed-potential pad 5D through internal wiring 9, no area is required for severally wire bonding on the major surface of the fixed-potential pad 5D, and the area whereon about a half of a stud bump for connecting to an option-setting pad 5C is sufficient. Therefore, the pad area of the fixed-potential pad 5D can be reduced, whereby the size of a semiconductor substrate 2 can be reduced.

Figure 8A:
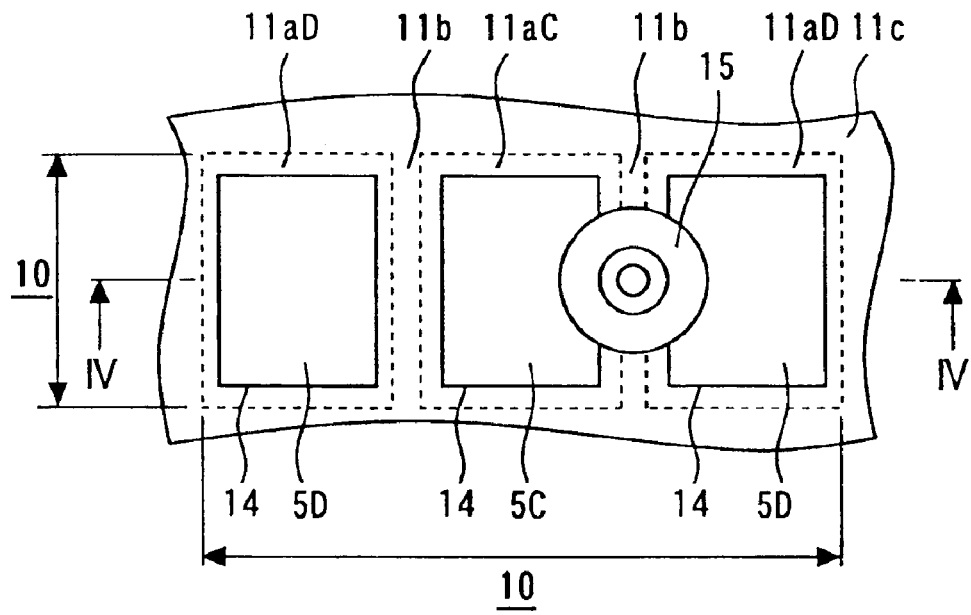
FIG. 8 shows an option-setting portion of another semiconductor device according to the fourth embodiment of the present invention.
Figure 8B:
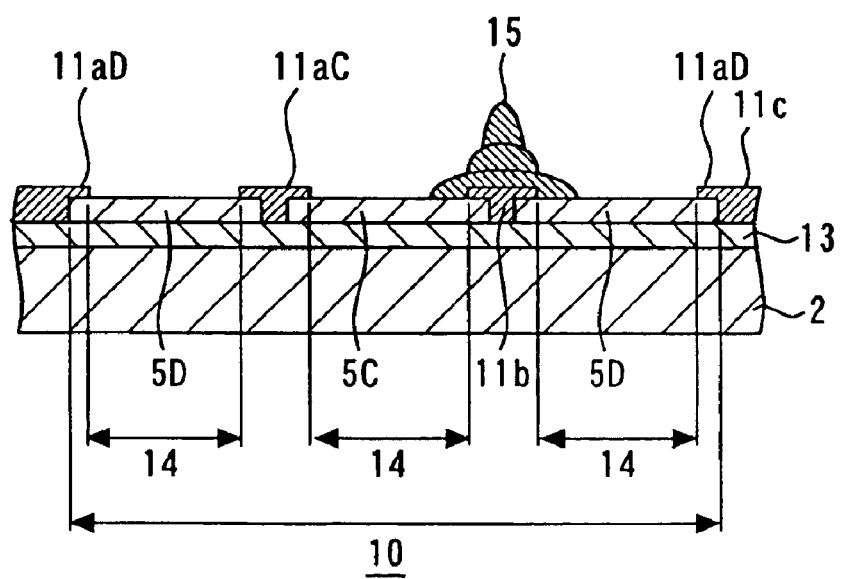

In the semiconductor device 1 of the fourth embodiment, although the area of a fixed-potential pad 5D is smaller than the area of a third pad, the area of a option-setting pad 5C can be smaller than the area of a third pad for the same reason. Furthermore, as FIG. 8 shows, the area of both the option-setting pad 5C and the fixed-potential pad 5D can be smaller than the area of a third pad.

Fifth Embodiment

Figure 9A:
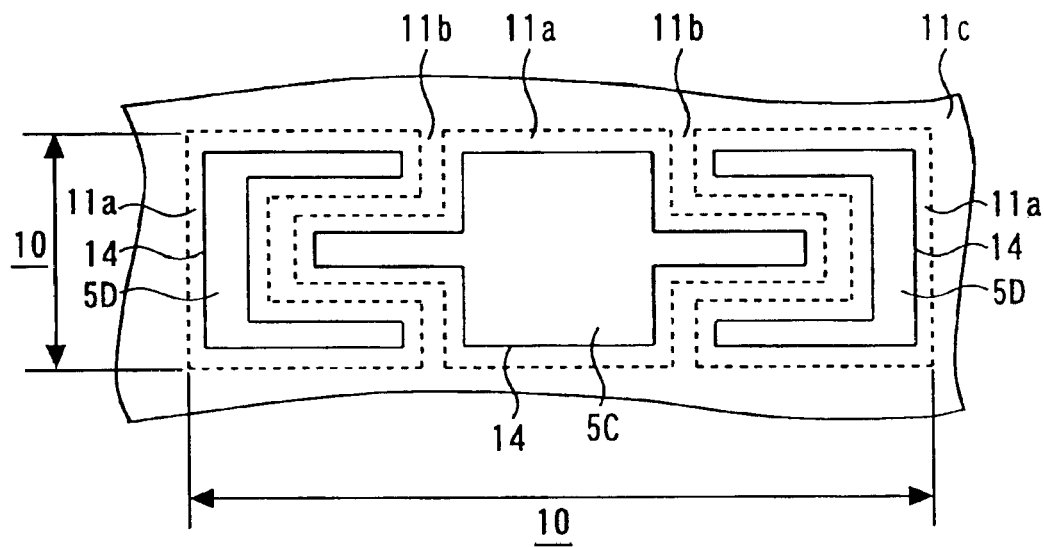
FIG. 9 shows an option-setting portion of a semiconductor device according to a fifth embodiment of the present invention.
Figure 9B:
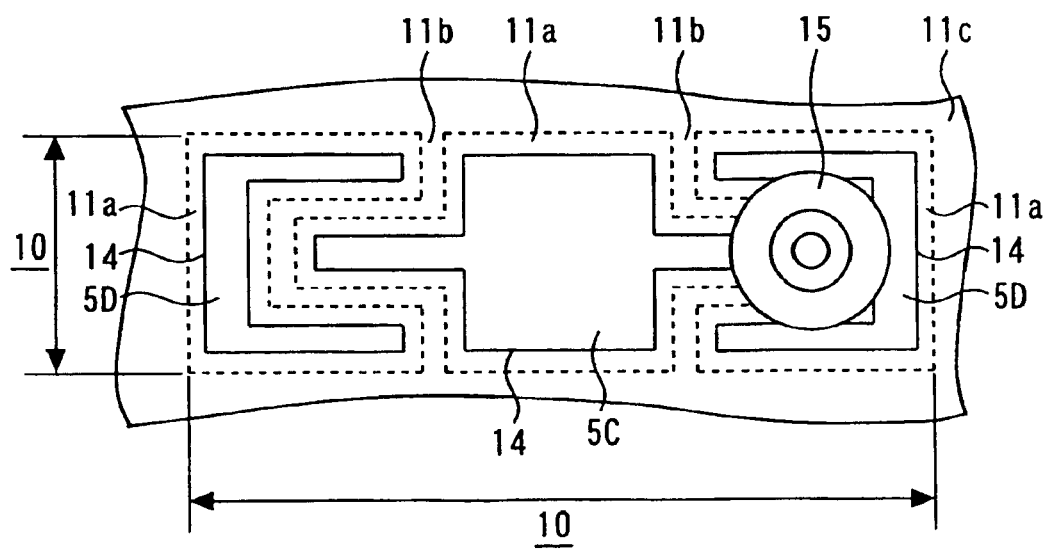

FIG. 9 is a plan showing the option-setting portion 10 of a semiconductor device according to a fifth embodiment of the present invention; FIG. 9A being a plan before forming a stud bump 15, and FIG. 9B being a plan after forming a stud bump 15. In the semiconductor device 1 of the fifth embodiment, the option-setting pad 5C is made to have a convex portion and the fixed-potential pad 5D is made to have a concave portion so that the option-setting pad 5C and the fixed-potential pad 5D face at two or more sides and fit to each other. The circumferential edges of the surfaces of option-setting pad 5C and the fixed-potential pad 5D are covered with a surface-protecting film 11a. A surface-protecting film 11b is present between the option-setting pad 5C and the fixed-potential pad 5D.

Since the option-setting pad 5C faces the fixed-potential pad 5D at two or more sides in the semiconductor device 1 of the fifth embodiment, the margin for the displacement in forming the stud bump 15 is widened, and the option-setting pad 5C can be stably connected to the fixed-potential pad 5D. In other words, although the stud bump 15 does not contact the fixed-potential pad 5D if the stud bump 15 is displaced a little to the left in the case of the semiconductor device 1 of the first embodiment shown in FIG. 2, the stud bump 15 can contact both the option-setting pad 5C and the fixed-potential pad 5D even if the stud bump 15 is displaced a little to the left or to the right in the case of the semiconductor device 1 of the fifth embodiment, because the upper and lower portions of the stud bump 15 also contact the fixed-potential pad 5D as shown in FIG. 9B. In addition, even if the stud bump 15 is displaced to upward or downward, it can contact either upper or lower portions of the fixed-potential pad 5D.

Sixth Embodiment

Figure 10A:
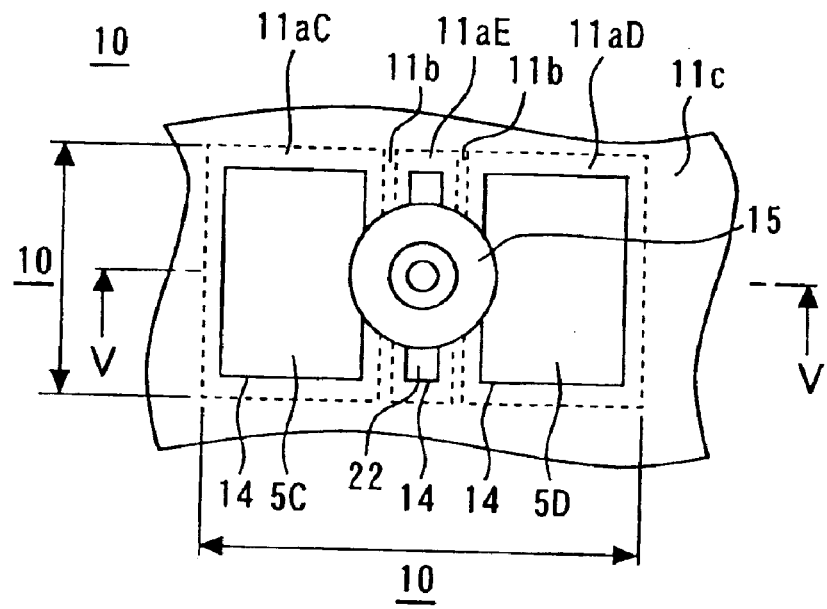
FIG. 10 shows an option-setting portion of a semiconductor device according to the sixth embodiment of the present invention.
Figure 10B:
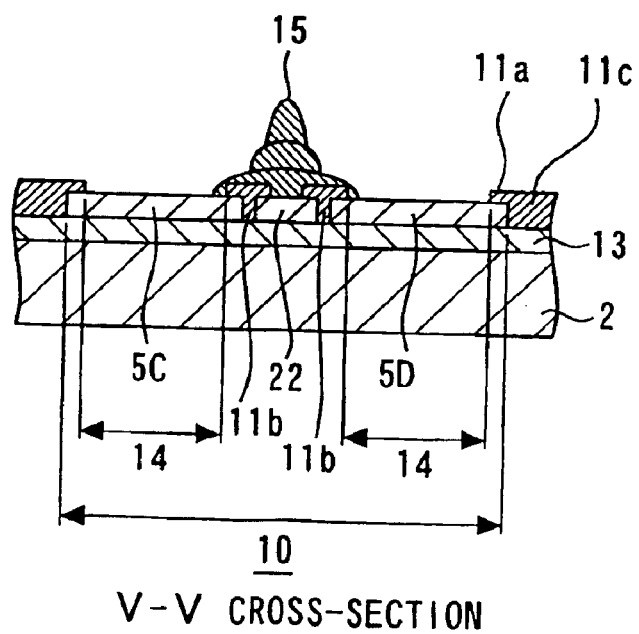

FIG. 10 shows an option-setting portion 10 of a semiconductor device according to a sixth embodiment of the present invention, FIG. 10A being a plan, and FIG. 10B being a sectional view along a dashed line V—V in FIG. 10A. In FIG. 10, reference numeral 22 denotes a dummy pad sandwiched by surface-protecting films 11b and adjacent to an option-setting pad 5C and a fixed-potential pad 5D made of the same materials as that of other pads, such as aluminum. The circumferential edge of the surface of the dummy pad 22 is covered with a surface-protecting film 11aE, which is a fourth surface-protecting film.

The option setting by the semiconductor device 1 is performed by the option-setting pad 5C, the surface-protecting film 11b provided between the option-setting pad 5C and the dummy pad 22, the dummy pad 22, the surface-protecting film 11b provided between the dummy pad 22 and the fixed-potential pad 5D, the fixed-potential pad 5D, and the stud bump 15 continuously provided on surface-protecting films 11aC, 11aD, and 11aE covering the circumferential edges of the surface of each pad.

Since the stud bump 15 can be joined to the opening 14 of the option-setting pad 5C, the opening 14 of the fixed-potential pad 5D, as well as the opening 14 of the dummy pad 22 by making the option-setting portion 10 have the structure shown in the sixth embodiment, the junction strength of the pad 5 to the stud bump 15 increases, and the peeling of the stud bump 15 becomes hard to occur.

Seventh Embodiment

Figure 11:
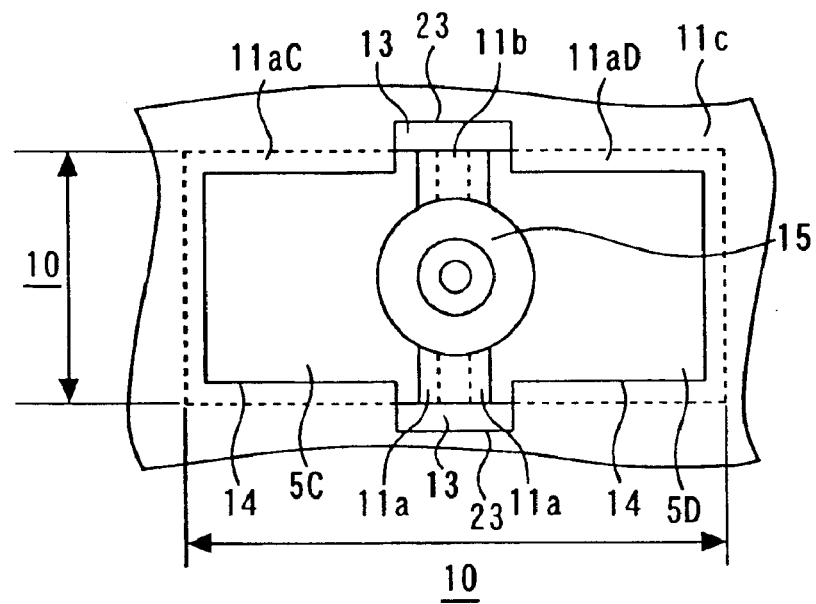
FIG. 11 shows an option-setting portion of a semiconductor device according to the seventh embodiment of the present invention.

FIG. 11 is a plan showing the option-setting portion 10 of a semiconductor device according to a seventh embodiment of the present invention. In FIG. 11, reference numeral 23 denotes channels of the surface-protecting film from the pad opening 14 of the option-setting pad 5C to the pad opening 14 of the fixed-potential pad 5D, formed by removing a part of surface-protecting films 11aC and 11aD which cover the pad 5C and 5D, and a part of the surface-protecting film 11c other than the option-setting portion by etching for separating the surface-protecting film, which is a portion contacting the stud bump 15 at the upper portion (the portion where 11b faces the pads 5C and 5D of 11aC and 11aD in FIG. 11) from other portions of the surface-protecting film (the portion where 11b does not face the pads 5C and 5D of 11aC and 11aD in FIG. 11). The pad 5D and the interlayer insulating film 13 are exposed on the bottoms of the channels 23.

Although the surface-protecting film 11 under the stud bump 15 maybe damaged by the stress when the stud bump 15*is* formed, the channels 23 can prevent the propagation of damage to the entire surface-protecting film 11.

Figure 12:
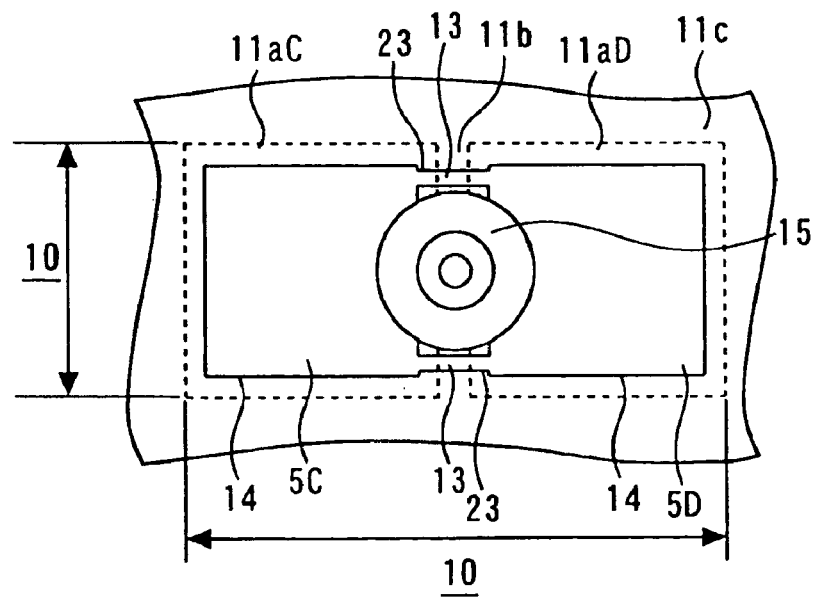
FIG. 12 shows an option-setting portion of another semiconductor device according to the seventh embodiment of the present invention.

In the seventh embodiment, although the channels 23 are formed on the surface-protecting films 11aC and 11aD which cover the pads 5C and 5D, and the surface-protecting film 11c other than the option-setting portion 10, the channels 23 may be formed on the second surface-protecting film 11b between the surface-protecting films 11aC and 11aD that cover pads 5C and 5D, and the pads 5C and 5D as FIG. 12 shows. Also in the seventh embodiment, although the channels 23 are formed by etching, a method wherein no surface-protecting film 11 of the portion of the channels 23 is formed from the beginning may be adopted.

Eighth Embodiment

Figure 13A:
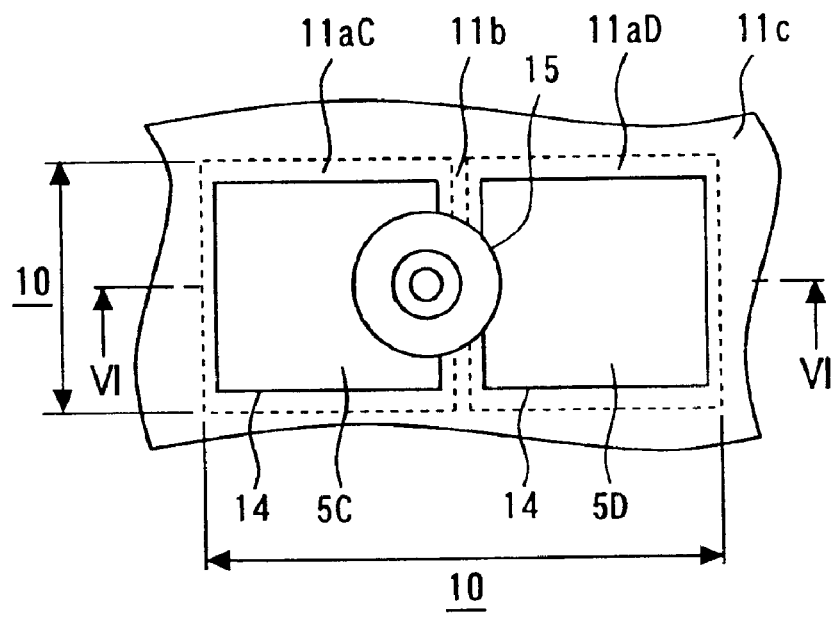
FIG. 13 shows an option-setting portion of a semiconductor device according to the eighth embodiment of the present invention.
Figure 13B:
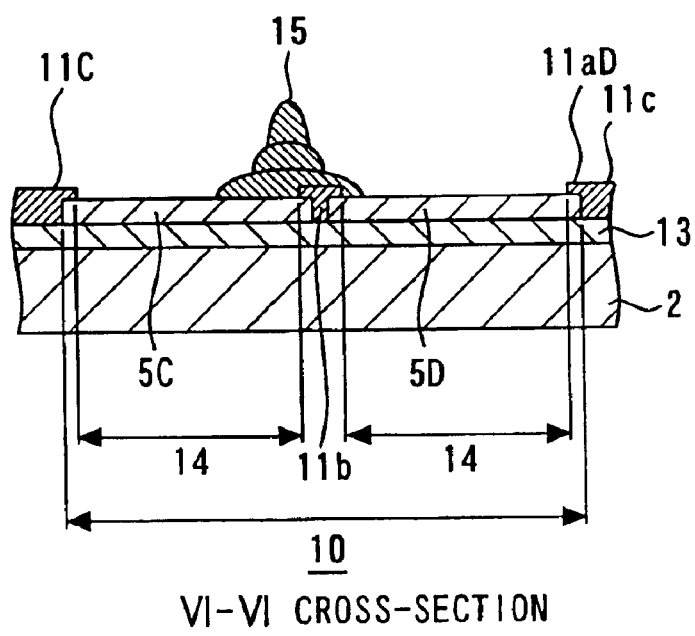

FIG. 13 shows an option-setting portion 10 of a semiconductor device according to an eighth embodiment of the present invention, FIG. 13A being a plan, and FIG. 13B being a sectional view along a dashed line VI—VI in FIG. 13A. In the semiconductor device of the eighth embodiment the stud bump 15 is formed so that the center of the contacting plane of the stud bump 15 to the pads 5 and the surface-protecting film 11 is displaced toward the option-setting pad 5C. This structure can join the wider portion of the width in the vertical direction of the stud bump 15 in FIG. 13A to the option-setting pad 5C, and enhance the joining strength between the stud bump 15 and the pads 5. The same effect can be obtained when the center of the contacting plane of the stud bump 15 to the pads 5 and the surface-protecting film 11 is displaced toward the fixed-potential pad 5D.

Ninth Embodiment

Figure 14A:
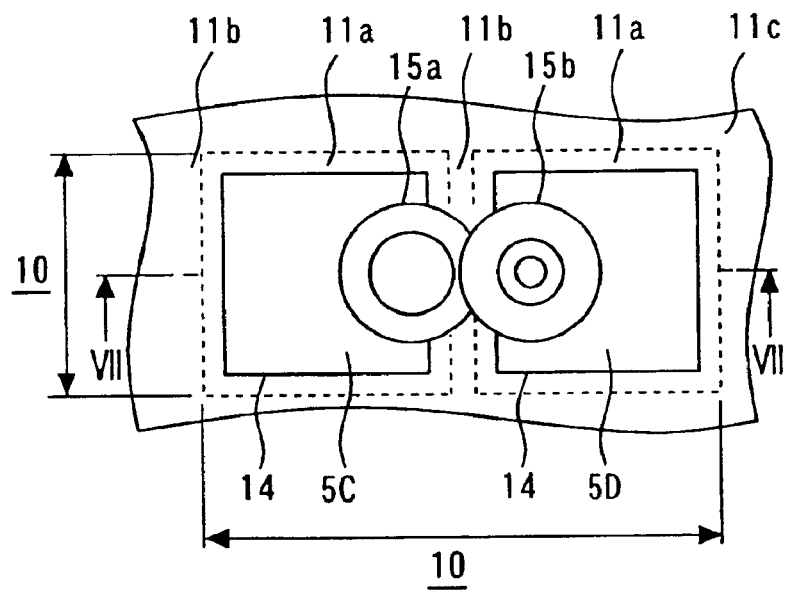
FIG. 14 shows an option-setting portion of a semiconductor device according to the ninth embodiment of the present invention.
Figure 14B:
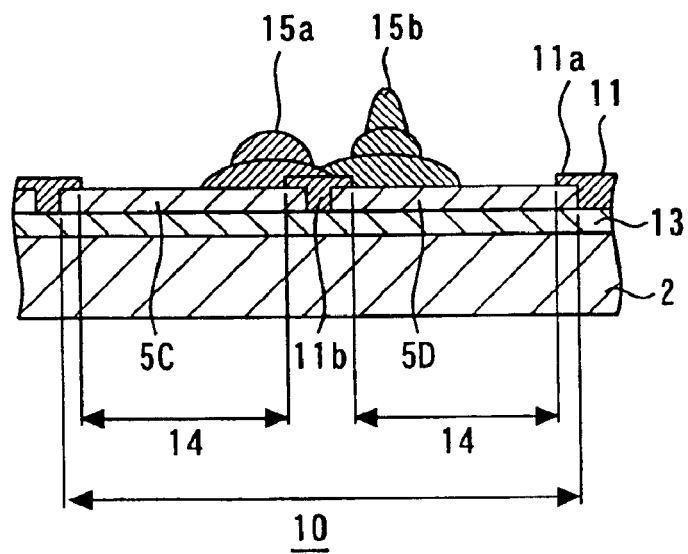

FIG. 14 shows an option-setting portion 10 of a semiconductor device according to a ninth embodiment of the present invention, FIG. 14A being a plan, and FIG. 14B being a sectional view along a dashed line VII—VII in FIG. 14A. In the semiconductor device of the ninth embodiment, the connection of the option-setting pad 5C to the fixed-potential pad 5D is performed by the stud bump 15a, which is the first conductor, formed to cover the option-setting pad 5C, the surface-protecting film 11aC, the surface-protecting film 11b between the option-setting pad 5C and the fixed-potential pad 5D, and the stud bump 15b, which is the second conductor, formed to cover the fixed-potential pad 5D, the surface-protecting film 11aD, and the bump 15a.

Since the contact area of the stud bump 15 and the pad 5 can be increased by making the stud bump 15 have this structure, the firm joining of the both can be secured. Also since each stud bump 15 plays a role for widening the area of the conductive portion of the pad 5, the margin for the displacement when the stud bumps are formed can be increased. In the ninth embodiment, although the stud bump 15b on the fixed-potential pad 5D side is formed after forming the stud bump 15a on the option-setting pad 5C side, the opposite order can also be used.

Tenth Embodiment

Figure 15A:
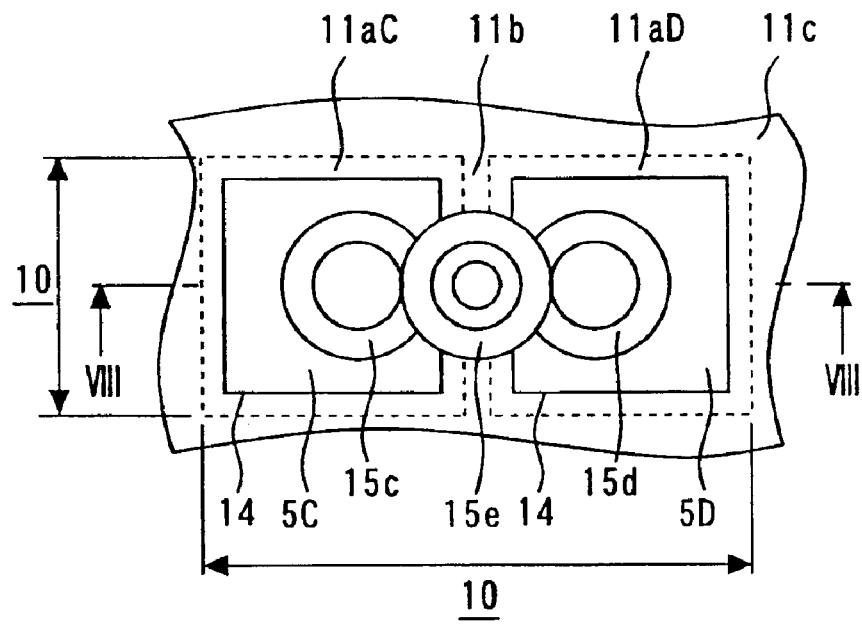
FIG. 15 shows an option-setting portion of a semiconductor device according to the tenth embodiment of the present invention.
Figure 15B:
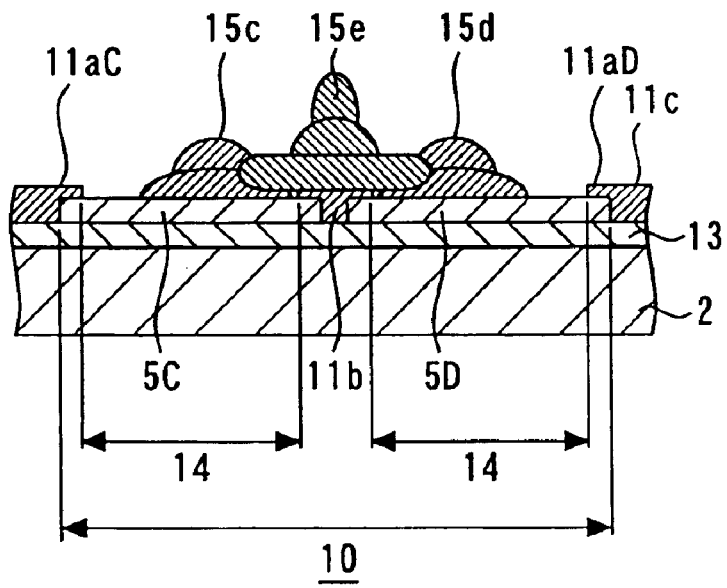

FIG. 15 shows an option-setting portion 10 of a semiconductor device according to a tenth embodiment of the present invention, FIG. 15A being a plan, and FIG. 15B being a sectional view along a dashed line VIII—VIII in FIG. 15A. In the semiconductor device 1 of the tenth embodiment, the connection of the option-setting pad 5C to the fixed-potential pad 5D is performed by the stud bump 15c, which is the third conductor, formed on the option-setting pad 5C, the stud bump 15d, which is the fourth conductor, formed on the fixed-potential pad 5D, and the stud bump 15e, which is the fifth conductor, formed so as to contact the stud bump 15c and the stud bump 15d. The damage to the surface-protecting film 11b between the pads 5 can be minimized by making the stud bump 15 have this structure at the time of forming the stud bump 15.

Eleventh Embodiment

Figure 16A:
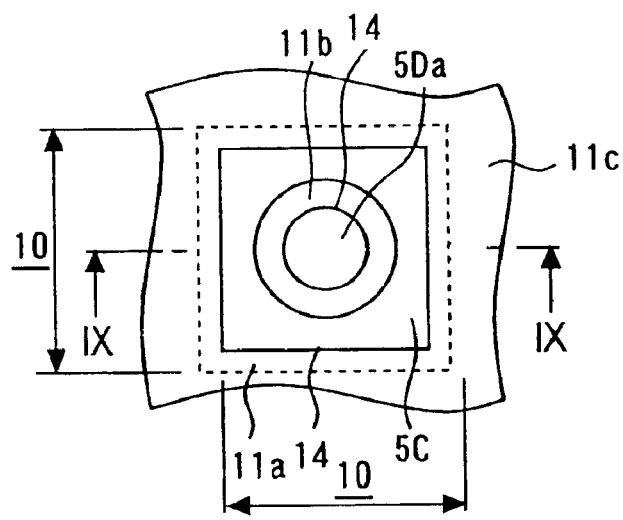
FIG. 16 shows an option-setting portion of a semiconductor device according to the eleventh embodiment of the present invention.
Figure 16B:
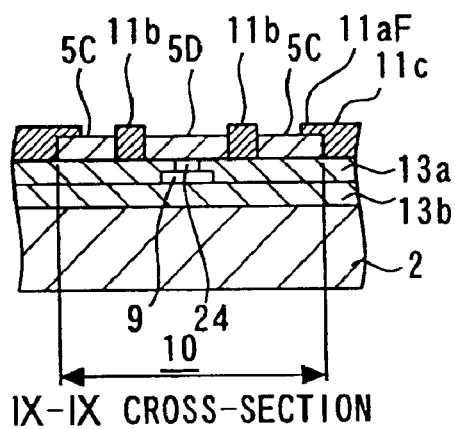
Figure 16C:
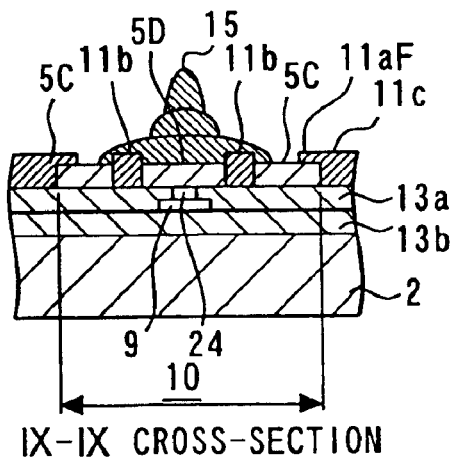

FIG. 16A is a plan of an option-setting portion of a semiconductor device according to an eleventh embodiment of the present invention, FIG. 16B is a sectional view along a dashed line IX—IX in FIG. 16A before forming a stud bump 15, and FIG. 16C is a sectional view along a dashed line IX—IX in FIG. 16A after forming a stud bump 15. In the semiconductor device 1 of the eleventh embodiment, a fixed-potential pad 5D, which is the fifth pad, provided through the surface-protecting film 11b, which is the sixth surface-protecting film, is formed inside the major surface of the option-setting pad 5C, which is the fourth pad whose circumferential edges are covered with the surface-protecting film 11aF, which is the fifth surface-protecting film. A predetermined voltage is supplied to the inside fixed-potential pad from the internal circuit (not shown) through the internal wiring 9 and the interlayer connecting plug 24. Also in the semiconductor device 1 of the eleventh embodiment, the connection of the option-setting pad 5C to the fixed-potential pad 5D is performed by the entire surface of the fixed-potential pad 5D, the entire surface of the surface-protecting film 11b between the fixed-potential pad 5D and the option-setting pad 5C, and the stud bump 15 continuously formed on the option-setting pad 5C.

The damage to the surface-protecting film 11b when the stud bump 15 is formed is not extended to the surface-protecting film (not shown) other than the option-setting portion 10 by making the option-setting portion 10 have this structure. In addition, since the entire surface of the surface-protecting film 11b is covered with the stud bump 15, even if the surface-protecting film 11b is damaged, the surface thereof is protected by the stud bump 15, and reliability is hard to lower.

Figure 17A:
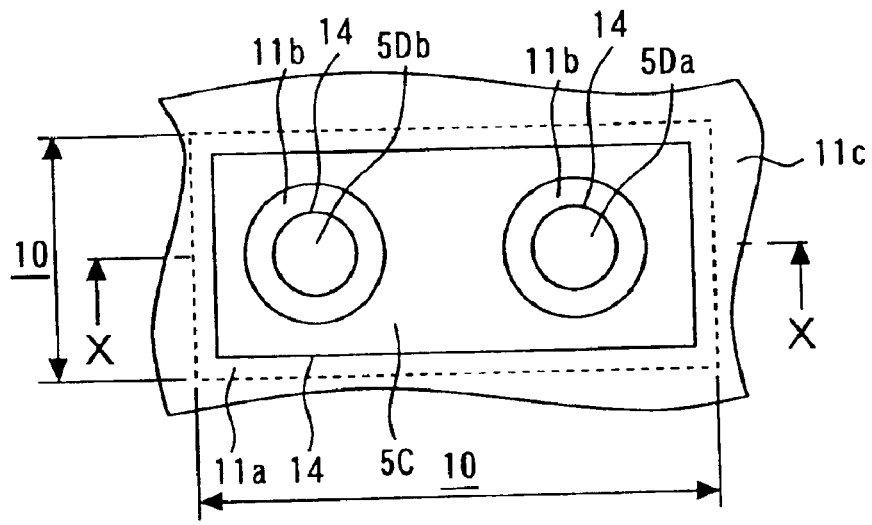
FIG. 17 shows an option-setting portion of another semiconductor device according to the eleventh embodiment of the present invention.
Figure 17B:
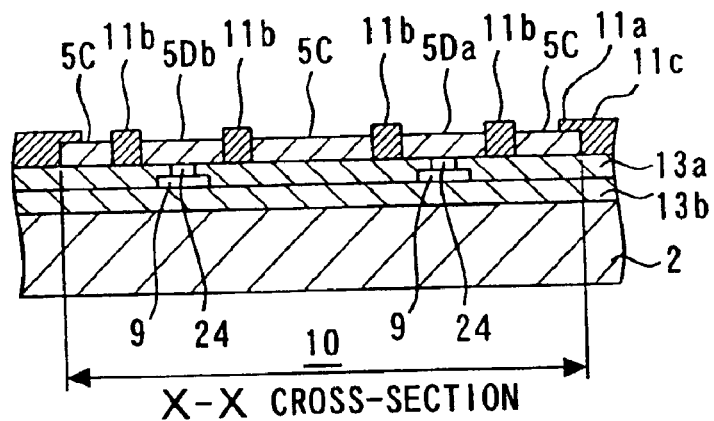
Figure 17C:
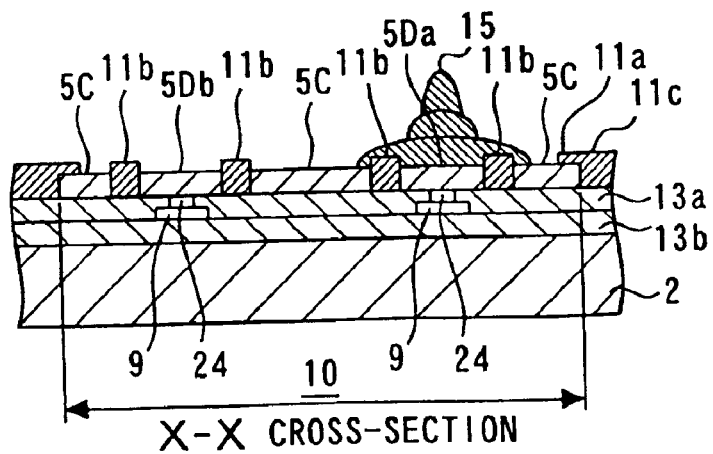

In the eleventh embodiment, although the surface-protecting film 11b for separating the fixed-potential pad 5D and the pad 5 is formed inside the major surface of the option-setting pad 5C, the surface-protecting film 11b for separating the option-setting pad 5C and the pad 5 may be formed inside the major surface of the fixed-potential pad 5D. As shown in FIG. 17, a plurality of fixed-potential pads 5D may be provided inside the option-setting pad 5C. When the option-setting pad 5C of the semiconductor device 1 is set to the source voltage, the stud bump 15 is formed so as to cover the entire surface of the fixed-potential pad 5Da set to the source voltage, the entire surface of the surface-protecting film 11b for separating the option-setting pad 5C from the fixed-potential pad 5Da, and the option-setting pad 5C as shown in FIG. 17C; and when the option-setting pad 5C is set to GND, the stud bump 15 is formed so as to cover the entire surface of the fixed-potential pad 5Db set to GND, the entire surface of the surface-protecting film 11b for separating the fixed-potential pad 5Db from the option-setting pad 5C, and the option-setting pad 5C. The option-setting pad 5C can be set to either the source voltage or GND by making the option-setting portion 10 have this structure.

The features and advantages of the present invention may be summarized as follows.

As described above, since the semiconductor device of the first invention comprises a semiconductor substrate; an interlayer insulating film formed on the semiconductor substrate; a fixed-potential pad formed on the interlayer insulating film and whose circumferential edges are covered with a surface-protecting film; option-setting pads formed on the interlayer insulating film facing the fixed-potential pad across a second surface-protecting film, and whose circumferential edges are covered with a third surface-protecting film; and conductors provided continuously on all the surface-protecting films, the fixed-potential pad, and the option-setting pad; the cracks of the interlayer insulating film or pad peeling are hard to occur in the option-setting process.

Since the area of at least one of the fixed-potential pad and the option-setting pad of the semiconductor device according to the second invention is smaller than the area of the other pads on the major surface of the semiconductor substrate, the size of the semiconductor device can be reduced.

In the semiconductor device of the third invention, since the surface-protecting film that contacts the conductor is separated from other surface-protecting films on the major surface of the semiconductor substrate, the diffusion of the damage of the surface-protecting film can be protected.

In the semiconductor device of the fourth invention, since the conductor is continuously provided on two or more option-setting pads and fixed-potential pads, the manufacturing man-hour can be saved.

In the semiconductor device of the fifth invention, since the fixed-potential pad faces the option-setting pad at two or more sides, the fixed-potential pad can be stably connected to the option-setting pad.

Since the semiconductor device of the sixth invention comprises a dummy pad whose circumferential edges facing both the fixed-potential pad and the option-setting pad across the surface-protecting film are covered with the surface-protecting film; and the conductor continuously contacts all the surface-protecting films, the fixed-potential pad, the dummy pad, and the option-setting pad, the fixed-potential pad can be stably connected to the option-setting pad.

Since the contacting area of the conductor and the major surface of the fixed-potential pad differs from the contacting area of the conductor and the major surface of the option-setting pad in the semiconductor device of the seventh invention, the wider portion of the stud bump is joined to one pad, and the joining strength of the stud bump and the pad can be enhanced.

In the semiconductor device of the eighth invention, since the conductor consists of the first conductor formed on either one of the fixed-potential pad and the option-setting pad, and on the surface-protecting film adjacent thereto, and the second conductor formed on the first conductor and the other one of the fixed-potential pad and the option-setting pad, the fixed-potential pad can be stably connected to the option-setting pad.

Furthermore, in the semiconductor device of the ninth invention, since the conductor consists of the third conductor formed on the major surface of the fixed-potential pad, the fourth conductor formed on the major surface of the option-setting pad, and the fifth conductor formed so as to contact both the third and fourth conductors, the damage to the surface-protecting film can be minimized.

In addition, since the semiconductor device of the tenth invention comprises a semiconductor substrate; an interlayer insulating film formed on the semiconductor substrate; a fixed-potential pad and an option-setting pad, one of which is positioned inside the major surface of the other across the surface-protecting film, and the circumferential edges of the other covered with the surface-protecting film; and the conductor provided across the fixed-potential pad and the option-setting pad; the damage of a surface-protecting film does not extend to other surface-protecting films.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-295175, filed on Oct. 8, 2002 including specification, claims, drawings and summary, on which the Convention priority of the present application is based, are incorporated herein by reference in its entirety.

What is claimed is:

1. A semiconductor device comprising:

a semiconductor substrate;

an interlayer insulating film formed on the semiconductor substrate;

a first pad formed on the interlayer insulating film and whose circumferential edges are covered with a first surface-protecting film;

a second pad formed on the interlayer insulating film facing the first pad across a second surface-protecting film, and whose circumferential edges are covered with a third surface-protecting film; and a conductor provided continuously on the first pad, the first to third surface-protecting films, and the second pad, wherein the first pad is a fixed-potential pad, and the second pad is an option-setting pad and is electrically connected to an internal circuit by an internal wiring.

2. The semiconductor device according to claim 1, further comprising:

an internal wiring formed between the semiconductor substrate and the interlayer insulating film; and a third pad formed on the interlayer insulating film whereto a thin metal wire is connected, wherein the first pad is connected to the internal wiring, and has an area smaller than the area of the third pad.

3. The semiconductor device according to claim 1, wherein the first to third surface-protecting films are separated into the portions in contact with the conductor and other portions.

4. The semiconductor device according to claim 1, further comprising one or more option-setting pads on which the conductor is further continuously provided.

5. The semiconductor device according to claim 1, wherein the first pad and the second pad face each other at two or more sides.

6. The semiconductor device according to claim 1, wherein the contact area of the conductor and the first pad differs from the contact area of the conductor and the second pad.

7. The semiconductor device according to claim 1, wherein the conductor comprises:
- a first conductor provided on the first pad and the first and the second surface-protecting films; and
- a second conductor provided on the first conductor, the second pad, and the third surface-protecting film.

8. The semiconductor device according to claim 1, wherein the conductor comprises:
- a first conductor element provided on the first pad;
- a second conductor element provided on the second pad; and
- a third conductor element provided on the first and second conductor elements.

9. A semiconductor device comprising:
- a semiconductor substrate;
- an interlayer insulating film formed on the semiconductor substrate;
- a first pad formed on the interlayer insulating film and whose circumferential edges are covered with a first surface-protecting film;
- a second pad formed on the interlayer insulating film facing the first pad across a second surface-protecting film, and whose circumferential edges are covered with a third surface-protecting film; and
- a conductor provided continuously on the first pad, the first to third surface-protecting films, and the second pad; and
- a dummy pad formed between the first pad and the second pad, and whose circumferential edges are covered with a fourth surface-protecting film;
- wherein the conductor is continuously provided also on the dummy pad and the fourth surface-protecting film.

10. A semiconductor device comprising:
- a semiconductor substrate;
- an interlayer insulating film formed on the semiconductor substrate;
- a first pad formed on the interlayer insulating film and whose circumferential edges are covered with a first surface-protecting film;
- a second pad provided inside the second pad across a second surface-protecting film; and
- a conductor continuously provided on the first pad, the second surface protecting film, and the second pad,
- wherein one of the first pad and the second pad is a fixed-potential pad, and another of the first pad and the second pad is an option-setting pad and is electrically connected to an internal circuit by an internal wiring.

* * * * *